United States Patent
Richter et al.

(10) Patent No.: US 10,622,494 B2
(45) Date of Patent: Apr. 14, 2020

(54) OPTOELECTRONIC COMPONENT AND METHOD OF PRODUCING AN OPTOELECTRONIC COMPONENT

(71) Applicant: OSRAM OLED GmbH, Regensburg (DE)

(72) Inventors: Daniel Richter, Bad Abbach (DE); Daniel Wiener, Wenzenbach (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/980,939

(22) Filed: May 16, 2018

(65) Prior Publication Data

US 2018/0337290 A1    Nov. 22, 2018

(30) Foreign Application Priority Data

May 18, 2017   (DE) .................. 10 2017 110 850

(51) Int. Cl.

| | |
|---|---|
| *H01L 21/00* | (2006.01) |
| *H01L 31/0203* | (2014.01) |
| *H01L 31/02* | (2006.01) |
| *H01L 31/0232* | (2014.01) |
| *H01L 33/62* | (2010.01) |
| *H01S 5/022* | (2006.01) |
| *H01L 33/52* | (2010.01) |
| *H01L 33/58* | (2010.01) |

(52) U.S. Cl.
CPC .... *H01L 31/0203* (2013.01); *H01L 31/02002* (2013.01); *H01L 31/02005* (2013.01); *H01L 31/02327* (2013.01); *H01L 33/62* (2013.01); *H01S 5/02244* (2013.01); *H01S 5/02288* (2013.01); *H01L 33/52* (2013.01); *H01L 33/58* (2013.01); *H01L 2224/48091* (2013.01); *H01L 2224/48227* (2013.01); *H01L 2933/005* (2013.01); *H01L 2933/0033* (2013.01); *H01L 2933/0058* (2013.01); *H01L 2933/0066* (2013.01); *H01S 5/02228* (2013.01)

(58) Field of Classification Search
None
See application file for complete search history.

(56) References Cited

U.S. PATENT DOCUMENTS

| | | | | |
|---|---|---|---|---|
| 3,778,685 | A  * | 12/1973 | Kennedy | H01L 23/3135 257/735 |
| 2013/0207144 | A1* | 8/2013 | Ramchen | H01L 33/52 257/98 |
| 2015/0221783 | A1* | 8/2015 | Tsukagoshi | H01L 31/02162 257/432 |

FOREIGN PATENT DOCUMENTS

| | | |
|---|---|---|
| DE | 102 43 247 A1 | 4/2004 |
| DE | 10 2009 010 468 A1 | 5/2010 |
| DE | 10 2009 033 287 A1 | 1/2011 |

(Continued)

*Primary Examiner* — Reema Patel
(74) *Attorney, Agent, or Firm* — DLA Piper LLP (US)

(57) ABSTRACT

An optoelectronic component includes a housing body comprising a mounting face and a leadframe embedded into the housing body. The leadframe comprises a first and a second leadframe section, wherein the leadframe sections each comprise a contact region and a terminal region. While the contact regions are exposed at the mounting face, the terminal regions project laterally from the housing body. The housing body is completely enclosed by a molding material, wherein the terminal regions are not enclosed by the molding material.

16 Claims, 5 Drawing Sheets

(56) References Cited

FOREIGN PATENT DOCUMENTS

DE    10 2010 026 343  A1    3/2012

\* cited by examiner

OPTOELECTRONIC COMPONENT AND METHOD OF PRODUCING AN OPTOELECTRONIC COMPONENT

TECHNICAL FIELD

This disclosure relates to an optoelectronic component and a method of producing an optoelectronic component.

BACKGROUND

Housing bodies produced by molding methods and comprising an embedded leadframe are known. By way of example, an optoelectronic semiconductor chip may be arranged in a cavity of a housing body. It is also known to fill cavities with a potting material and equip housing bodies with lenses.

There is nonetheless a need to provide an improved optoelectronic component and method of producing an optoelectronic component.

SUMMARY

We provide a method of producing an optoelectronic component including producing a housing body by a first molding method, wherein a leadframe is embedded into the housing body, the housing body includes a mounting face, the leadframe includes a first leadframe section and a second leadframe section, the leadframe sections each have a contact region and a terminal region, the contact regions are exposed at the mounting face, and the terminal regions project laterally from the housing body, and arranging a molding material by a second molding method, wherein the housing body is completely enclosed by the molding material, and a molding tool used in the second molding method is sealed during the process of arranging the molding material at the terminal regions.

We also provide an optoelectronic component including a housing body, wherein the housing body includes a mounting face, the housing body includes an embedded leadframe, the leadframe includes a first leadframe section and a second leadframe section, the leadframe sections each include a contact region and a terminal region, the contact regions are exposed at the mounting face of the housing body, the terminal regions project laterally from the housing body, the housing body is completely enclosed by a molding material, and the terminal regions are not enclosed by the molding material.

Figure 1:
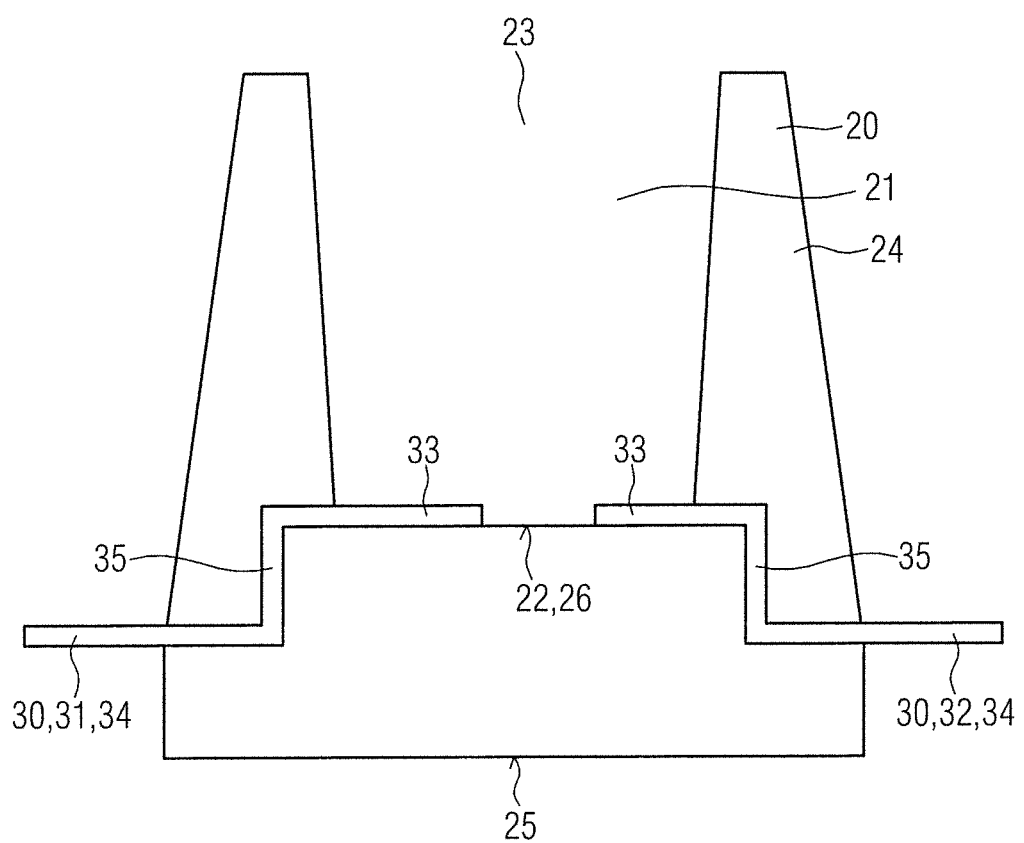
FIG. 1 schematically shows a housing body with a leadframe.

LIST OF REFERENCE SIGNS 10 optoelectronic component
20 housing body
21 cavity of the housing body
22 bottom of the cavity
23 opening of the cavity
24 wall of the cavity
25 underside of the housing body
26 mounting face of the housing body
30 leadframe
31 first leadframe section
32 second leadframe section
33 contact region of a leadframe section
34 terminal region of a leadframe section
35 connection section of a leadframe section
36 sealing section of a terminal region
40 optoelectronic semiconductor chip
41 top side of the optoelectronic semiconductor chip
42 underside of the optoelectronic semiconductor chip
50 wire
60 molding material
61 lens
70 potting material
80 molding tool
81 upper section of the molding tool
82 lower section of the molding tool
83 molding cavity
90 separating line

DETAILED DESCRIPTION

Our method of producing an optoelectronic component comprises the following method steps: first, a housing body is produced by a first molding method, wherein a leadframe is embedded into the housing body. The housing body comprises a mounting face. The leadframe comprises a first leadframe section and a second leadframe section. The leadframe sections each comprise a contact region and a terminal region. The contact regions are exposed at the mounting face, while the terminal regions project laterally from the housing body. In a further method step, a molding material is arranged by a second molding method, wherein the housing body is completely enclosed by the molding material. In this case, a molding tool used in the second molding method is sealed during the process of arranging the molding material at the terminal regions. The process of arranging the molding material is advantageously oriented to the terminal regions of the leadframe projecting laterally from the housing body. The molding tool used in the second molding method is thus sealed at the terminal regions. This constitutes a particularly simple variant of sealing.

After producing the housing body, an optoelectronic semiconductor chip may be arranged at the mounting face of the housing body and connects to the contact regions of the leadframe sections. Advantageously, an optoelectronic semiconductor chip may emit or detect electromagnetic radiation.

The housing body may comprise a cavity. The mounting face is a bottom of the cavity. After arranging the optoelectronic semiconductor chip at the bottom of the cavity, a potting material is arranged in the cavity, wherein the optoelectronic semiconductor chip is at least partly embedded into the potting material. Advantageously, the potting material may protect an optoelectronic semiconductor chip embedded therein against a critical temperature or a critical pressure that may prevail in a molding method.

Arranging the potting material may be carried out by a dosing method. Advantageously, a defined amount of the potting material may be arranged in the cavity of the housing body by a dosing method.

In the course of arranging the molding material, a lens may be shaped from the molding material above the mounting face of the housing body. This example of the method affords the advantage that a lens need not be placed on to the housing body. While securing an individual lens that has already been fabricated entails an undesired offset of the lens, a lens formed directly from a molding material during the process of arranging the molding material by a second molding method is distinguished by a relatively small offset of a few 10 μm. This variant of the method additionally affords the advantage of robust reproducibility with regard to the lens position. In this case, accuracy and reproducibility are ensured by the molding tool being sealed at the terminal regions projecting laterally from the housing body.

The terminal regions projecting laterally from the housing body may be reshaped. Advantageously, the terminal regions may be reshaped such that the optoelectronic component is compatible with an electrical interface.

The first molding method may be an injection molding method. Advantageously, the shape and the surface structure of a housing body may be chosen freely during injection molding.

The second molding method may be a transfer molding method. Advantageously, transfer molding is distinguished by the reproducible quality of the end products.

The leadframe may comprise a plurality of adjacent first and second leadframe sections, wherein the terminal regions of adjacent first and second leadframe sections are connected to one another. Pairs of a first and a second leadframe section are each embedded into a housing body, wherein the contact regions of adjacent first and second leadframe sections are arranged in an exposed fashion at the mounting face of a housing body. In additional method steps, the optoelectronic components connected via the leadframe are singulated, wherein respectively the terminal regions of adjacent first and second leadframe sections are separated from one another. Advantageously, a plurality of optoelectronic components may be produced simultaneously according to this method. If, in the course of arranging the molding material on a multiplicity of housing bodies, lenses are shaped from the molding material and arranged above the mounting faces of the housing bodies, this results in a relatively small variation of the beam guiding characteristic along the individual optoelectronic components. A homogeneous quality of the optoelectronic components is thus ensured. Compared to securing individual lenses, production costs may be reduced by simultaneous production of a multiplicity of optoelectronic components provided with lenses.

An optoelectronic component comprises a housing body comprising a mounting face. The housing body comprises an embedded leadframe, wherein the leadframe comprises a first leadframe section and a second leadframe section. The leadframe sections each comprise a contact region and a terminal region, wherein the contact regions are exposed at the mounting face, while the terminal regions project laterally from the housing body. The housing body is completely enclosed by a molding material, wherein the terminal regions are not enclosed by the molding material. Advantageously, the optoelectronic component may be produced in a simple manner.

An optoelectronic semiconductor chip may be arranged at the mounting face of the housing body and connects to the contact regions of the leadframe sections. Advantageously, an optoelectronic component equipped with an optoelectronic semiconductor chip may fulfill a multiplicity of functions: the optoelectronic component may be, for example, an optical indicator, a backlighting unit, an automobile lighting unit in the interior of an automobile, a coupling-in device for an optical waveguide, a signal luminaire or a symbol luminaire. The optoelectronic component may also be part of video screens and full-color on-screen displays.

The housing body may comprise a cavity. The mounting face is a bottom of the cavity. Advantageously, a potting material may be arranged in the cavity of a housing body.

A potting material may be arranged in the cavity, wherein the optoelectronic semiconductor chip is at least partly embedded into the potting material. Advantageously, the potting material may fulfill various functions. By way of example, refractive index matching may be carried out by selection of a potting material. It is also possible for the potting material to comprise wavelength-converting properties.

The molding material may form a lens above the mounting face of the housing body. By way of example, the lens may focus electromagnetic radiation emitted by the optoelectronic semiconductor chip or is incident thereon. Advantageously, the shape of the lens may be selected as desired such that the lens might also disperse electromagnetic radiation emitted by the optoelectronic semiconductor chip. Furthermore, the optoelectronic component is distinguished by a beam guiding characteristic exhibiting few aberrations.

The molding material and the potting material may each comprise an epoxy or a silicone. Advantageously, these materials are suitable for insulation and may thus afford protection against corrosion. Moreover, the performance of epoxies and silicones is based on the modification of their chemical structure, as a result of which a diversity of material properties are accessible. By way of example, optical properties may be selected in a targeted manner.

The optoelectronic semiconductor chip may be a laser diode chip, a light-emitting diode chip or a photodiode chip. Advantageously, the optoelectronic component may emit or detect electromagnetic radiation, depending on the function of the optoelectronic semiconductor chip. A laser diode chip affords the advantage that monochromatic electromagnetic radiation may be emitted.

The above-described properties, features and advantages and the way in which they are achieved will become clearer and more clearly understood in association with the following description of examples that are explained in greater detail in association with the drawings.

FIG. 1 shows a schematic sectional illustration of a housing body 20 with a leadframe 30 embedded therein. The housing body 20 comprises a cavity 21 comprising a bottom 22, an opening 23 and a wall 24. Furthermore, the housing body 20 comprises an underside 25.

A housing body 20 comprising a cavity 21 is illustrated in the example shown in FIG. 1. However, the component is not restricted to housing bodies 20 comprising cavities 21. The housing body 20 may also be formed such that the wall 24 and thus also the cavity 21 are omitted. Instead of the bottom 22 of the cavity 21 identified by reference sign 22, the housing body 20 then merely comprises a mounting face 26. An opening 23 would therefore not be present either. However, only the variant in which the housing body 20 comprises a cavity 21 is intended to be explained below. This applies to all the figures shown. To always clarify that a housing body 20 need not necessarily comprise a cavity 21, the bottom 22 of the cavity 21 is also identified by the reference sign 26 chosen for the mounting face 26.

The housing body 20 is produced by a first molding method, wherein the leadframe 30 is embedded into the housing body 20 during production. The material from which the housing body 20 is molded may comprise a polyphthalamide (PPA), for example. The first molding method may be an injection molding method, for example.

The leadframe 30 is a metallic conductor suitable for soldering. The leadframe 30 may be present, for example, in the form of a flat metal sheet. The leadframe 30 comprises a first leadframe section 31 and a second leadframe section 32. The leadframe sections 31, 32 are electrically isolated from one another. The leadframe sections 31, 32 each comprise a contact region 33 and a terminal region 34. The contact regions 33 are exposed at the bottom 22 of the cavity 21 of the housing body 20, that is to say that they are not covered by the material of the housing body 20. The terminal regions 34 project laterally from the housing body 20, that is to say that they project from the wall 24 of the cavity 21. In the example shown, the terminal regions 34 project from two sections of the wall 24 of the cavity 21 situated opposite one another. However, the terminal regions 34 may also project from two sections of the wall 24 not situated opposite one another.

Furthermore, the contact regions 33 extend parallel to the terminal regions 34, wherein the contact regions 33 and the terminal regions 34 of a leadframe section 31, 32 connect to one another via a connection section 35. In FIG. 1, the connection sections 35 extend perpendicularly to the contact regions 33 and the terminal regions 34. With respect to the bottom 22 of the cavity 21, the contact regions 33, the terminal regions 34 and the connection sections 35 may also comprise other angles of inclination. The connection sections 35 may also be omitted. Thus, the contact region 33 of a leadframe section 31, 32 may directly connect to the terminal region 34 thereof such that a leadframe section 31, 32 may be formed in a planar fashion.

Figure 2:
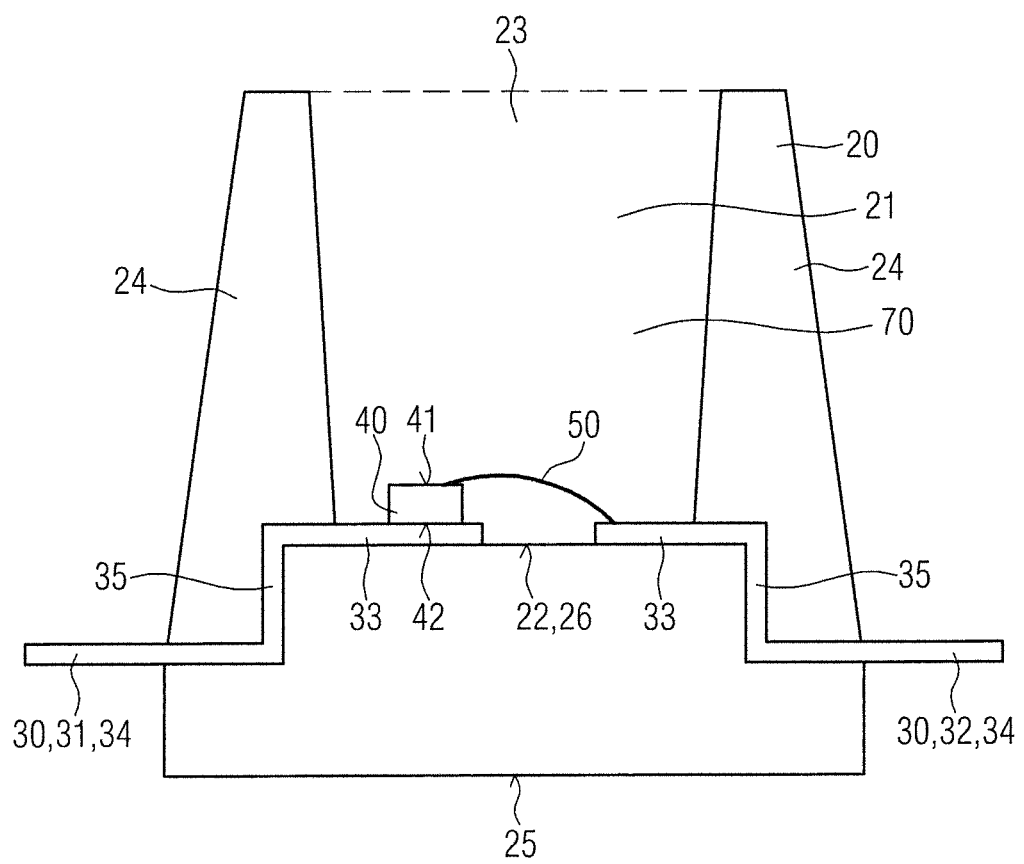
FIG. 2 schematically shows a housing body with an optoelectronic semiconductor chip and a potting material.

FIG. 2 shows the housing body 20 with an optoelectronic semiconductor chip 40 arranged in the cavity 21 and a potting material 70 arranged in the cavity 21.

The optoelectronic semiconductor chip 40 comprises a top side 41 and an underside 42. In the example illustrated, the optoelectronic semiconductor chip 40 is arranged by its underside 42 on the contact region 33 of the first leadframe section 31 and connects by a wire 50 to the contact region 33 of the second leadframe section 32. However, the optoelectronic semiconductor chip 40 may also be arranged differently. By way of example, the optoelectronic semiconductor chip 40 may be arranged by its underside 42 directly at the bottom 22 of the cavity 21. In this case, the optoelectronic semiconductor chip 40 may connect by two wires 50 respectively to the contact regions 33 of the first leadframe section 31 and the second leadframe section 32. Other contactings such as, for example, adhesive-bonding, clamping or soldering connections, are also possible.

The optoelectronic semiconductor chip 40 may be configured to emit electromagnetic radiation. However, the optoelectronic semiconductor chip 40 may also be provided to detect electromagnetic radiation. If the optoelectronic semiconductor chip 40 is intended to emit electromagnetic radiation, then it may be, for example, a laser diode chip or a light-emitting diode chip. When the optoelectronic semiconductor chip 40 is a laser diode chip, the optoelectronic semiconductor chip 40 may be, for example, a surface emitter or an edge emitter. If the optoelectronic semiconductor chip 40 is an edge emitter, then additional beam deflecting optoelectronic elements may be arranged in the cavity 21. It is also possible for the optoelectronic semiconductor chip 40 to be a white light source. If the optoelectronic semiconductor chip 40 is provided to detect electromagnetic radiation at its top side 41, then it may be a photodiode chip, for example.

In an optional method step, potting material 70 may be arranged in the cavity 21 of the housing body 20. The potting material 70 may comprise, for example, an epoxy or a silicone. Arranging the potting material 70 may be carried out, for example, by a dosing method. In the example illustrated in FIG. 2, the cavity 21 is completely filled with the potting material 70. This is not absolutely necessary. The amount of the potting material 70 may also be selected such that the optoelectronic semiconductor chip 40 is at least partly embedded into the potting material 70.

By contrast, if the optoelectronic semiconductor chip 40 is completely embedded into the potting material 70, then there is, for example, the possibility of refractive index matching by selection of the potting material 70. Moreover, the potting material 70 may comprise wavelength-converting properties. By way of example, particles that modify the wavelength of the electromagnetic radiation emitted by the optoelectronic semiconductor chip 40 may be embedded into the potting material 70. However, the potting material 70 may also be omitted.

Figure 3:
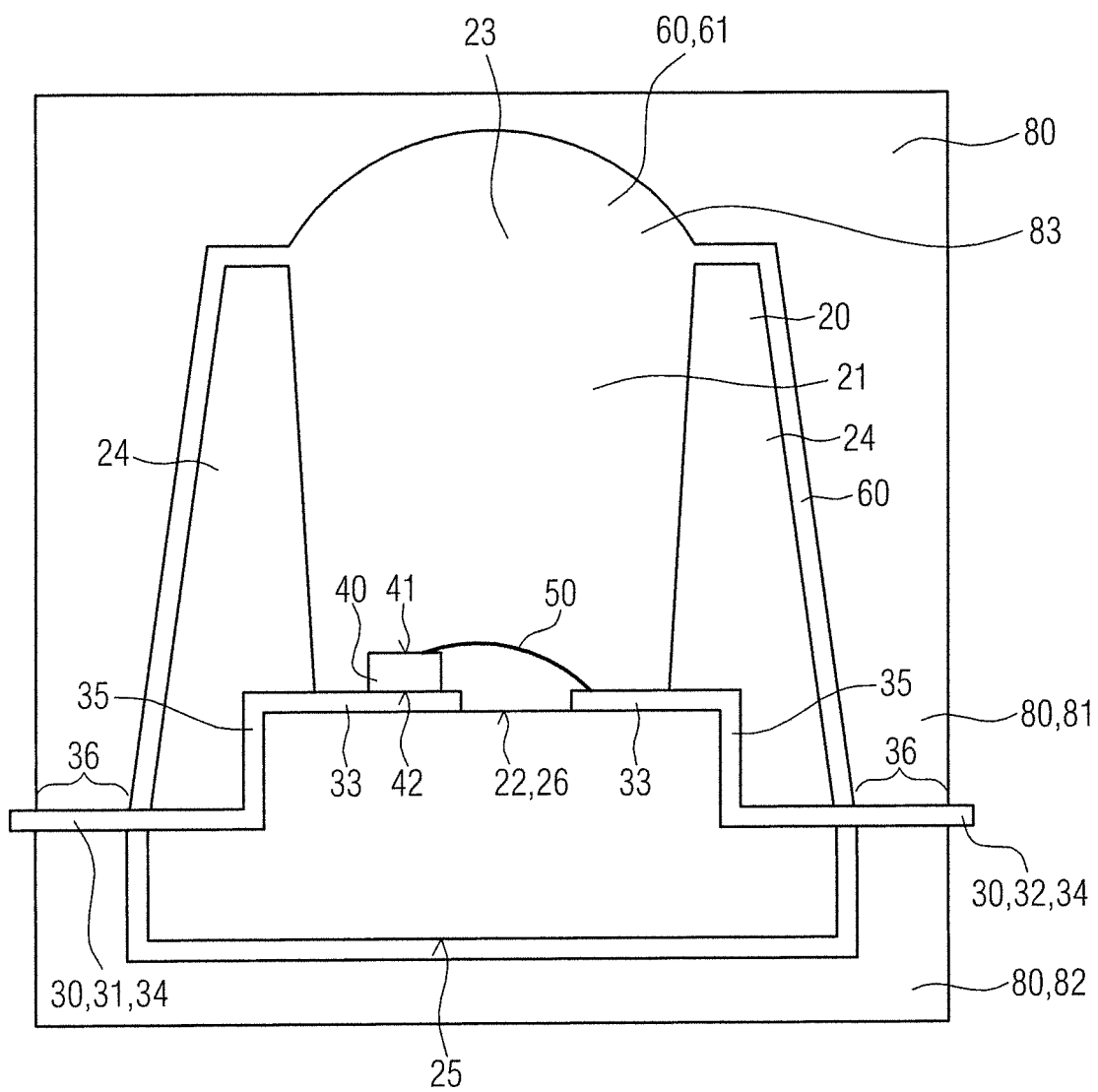
FIG. 3 schematically shows the process of arranging a molding material by a second molding method.

FIG. 3 shows a schematic sectional view of the process of arranging a molding material 60 by a second molding method, wherein the housing body 20 illustrated in FIG. 2 is used. In this case, no potting material 70 is arranged in the cavity 21.

A molding tool 80 used in the second molding method is likewise illustrated in FIG. 3. The molding tool comprises an upper section 81 and a lower section 82. Other constituent parts of the molding tool 80 such as, for example, an inflow channel or a press piston, are not illustrated in FIG. 2. The upper section 81 and the lower section 82 are sealed during the process of arranging a molding material 60 at the terminal regions 34 of the leadframe sections 31, 32. The upper section 81 and the lower section 82 of the molding tool thus come into contact with the terminal regions 34 of the leadframe sections 31, 32 during the process of arranging the molding material 60 at sealing regions 36 of the terminal regions 34. As a result, the sealing regions 36 of the terminal regions 34 remain free of the molding material 60. This enables a contacting of an optoelectronic component 10.

The upper section 81 and the lower section 82 of the molding tool 80 enclose a molding cavity 83 that predefines the actual shape of the optoelectronic component 10. The molding material 60 is arranged such that the housing body 20 is completely enclosed by the molding material 60. The second molding method may be a transfer molding method, for example. The molding material 60 may comprise, for example, an epoxy or a silicone. In the example illustrated in FIG. 3, no potting material 70 is arranged in the cavity 21. Instead, the cavity 21 is filled with the molding material 60.

In the example illustrated, the molding material 60 forms a lens 61 above the cavity 21 of the housing body 20. In the example illustrated, the lens 61 is convex. However, the lens 61 may also be formed in a concave fashion such that the lens 61 may be provided either to focus or to disperse electromagnetic radiation. The lens 61 may be provided, for example, to focus electromagnetic radiation emitted by the optoelectronic semiconductor chip 40. When the optoelectronic semiconductor chip 40 is a photodiode, the lens may also focus incident electromagnetic radiation onto the top side 41 of the optoelectronic semiconductor chip 40. However, the lens 61 may also be omitted. In this case, the molding material 60 would comprise a planar surface at an opening 23 of the cavity 21.

Figure 4:
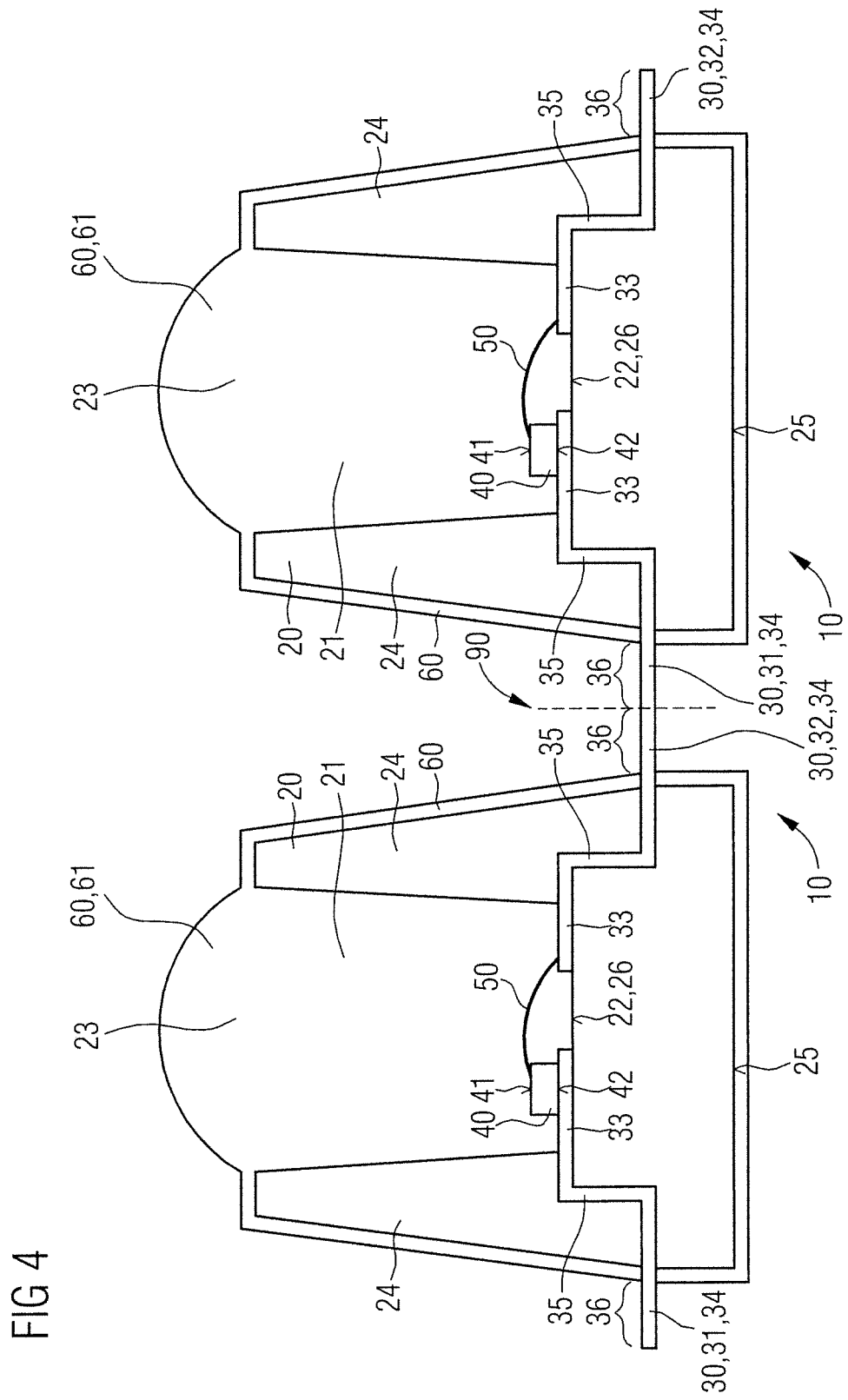
FIG. 4 schematically shows two optoelectronic components connected via terminal regions of a leadframe.

FIG. 4 schematically indicates the simultaneous production of a multiplicity of optoelectronic components 10. In this case, the leadframe 30 comprises a plurality of adjacent first and second leadframe sections 31, 32, wherein the terminal regions 34 of adjacent first and second leadframe sections 31, 32 connect to one another. During production, pairs of a first and a second leadframe section 31, 32 are each embedded into a housing body 20, wherein the contact regions 33 of adjacent first and second leadframe sections 31, 32 are arranged in an exposed fashion at the bottom 22 of the cavity 21 of a housing body 20. After production of the housing bodies 20, optoelectronic semiconductor chips 40 are respectively arranged at the bottom 22 of a cavity 21 and connected to the contact regions 33 of the respective leadframe sections 31, 32. Optionally, in a further method step, the potting material 70 may be arranged in the cavities 21 of the housing bodies 20, wherein the optoelectronic semiconductor chips 40 are at least partly embedded into the potting material 70. Furthermore, the molding material 60 is arranged by the second molding method, wherein the housing bodies 20 are completely enclosed by the molding material 60 and wherein a molding tool 80 used in the second molding method is sealed during the process of arranging the molding material 60 at the terminal regions 34. In this example, the optoelectronic components 10 connected via the leadframe 30 are singulated in an additional method step, wherein respectively the terminal regions 34 of adjacent first and second leadframe sections 31, 32 are separated from one another. This is indicated by a separating line 90 in FIG. 4.

An assemblage of a plurality of optoelectronic components 10 is indicated in FIG. 4. However, the assemblage of a plurality of optoelectronic components 10 is not restricted to one dimension. Rather, a two-directional assemblage may also be present. In this case, the optoelectronic components 10 illustrated in FIG. 4 connect to further optoelectronic components 10 perpendicularly to the plane of the drawing. In this case, the optoelectronic components 10 connect to one another such that the molding material 60 of adjacent housing bodies 20 is formed in a continuous fashion. To carry out a singulation of the optoelectronic components 10, the molding material 60 may be cut or sawn between adjacent housing bodies 20.

Figure 5:
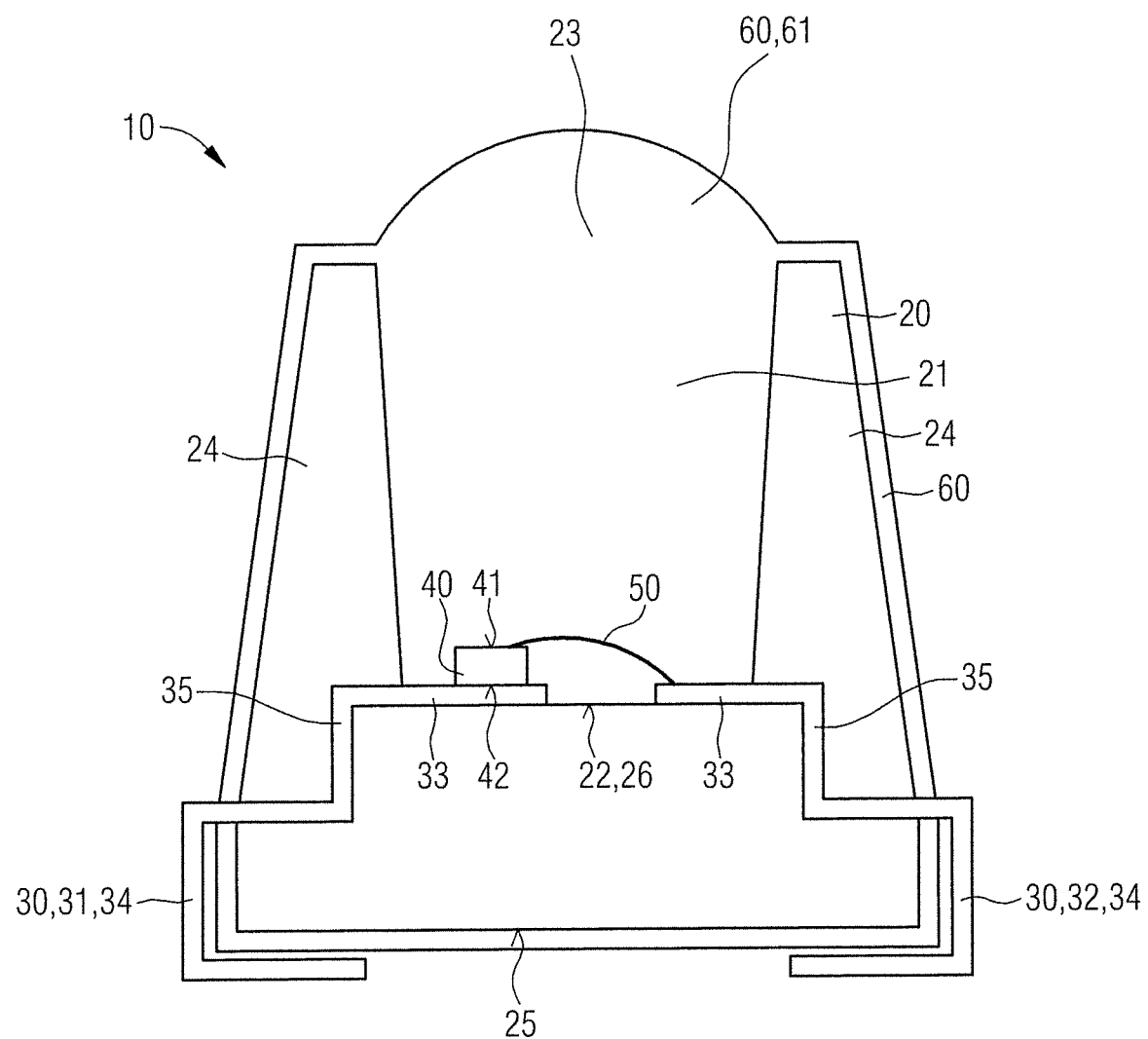
FIG. 5 schematically shows an optoelectronic component comprising reshaped terminal regions.

In a further method step, the terminal regions 34 projecting laterally from the housing body 20 are reshaped. This is illustrated in FIG. 5. The terminal regions 34 are reshaped such that at least one section of the terminal regions 34 is arranged along the underside 25 of the housing body 20. This enables surface mounting of the optoelectronic component 10.

Our components and methods have been illustrated and described in more specific detail on the basis of preferred examples. Nevertheless, this disclosure is not restricted to the examples disclosed. Rather, other variations may be derived therefrom by those skilled in the art, without departing from the scope of protection of the appended claims.

The invention claimed is:

1. A method of producing an optoelectronic component comprising:
producing a housing body by a first molding method, wherein a leadframe is embedded into the housing body, the housing body comprises a mounting face, the leadframe comprises a first leadframe section and a second leadframe section, the leadframe sections each have a contact region and a terminal region, the contact regions are exposed at the mounting face, and the terminal regions project laterally from the housing body; and
arranging a molding material by a second molding method, wherein the housing body is completely enclosed by the molding material, and a molding tool used in the second molding method is sealed during the process of arranging the molding material at the terminal regions.

2. The method according to claim 1, further comprising, after producing the housing body,
arranging an optoelectronic semiconductor chip at the mounting face of the housing body, and
connecting the optoelectronic semiconductor chip to the contact regions of the leadframe sections.

3. The method according to claim 2, wherein the housing body comprises a cavity, the mounting face is a bottom of the cavity, and, after arranging the optoelectronic semiconductor chip at the bottom of the cavity, further comprising arranging a potting material in the cavity, wherein the optoelectronic semiconductor chip is at least partly embedded into the potting material.

4. The method according to claim 3, wherein arranging the potting material is carried out by a dosing method.

5. The method according to claim 1, wherein, in the course of arranging the molding material, a lens is shaped from the molding material above the mounting face of the housing body.

6. The method according to claim 1, further comprising reshaping the terminal regions projecting laterally from the housing body.

7. The method according to claim 1, wherein the first molding method is an injection molding method.

8. The method according to claim 1, wherein the second molding method is a transfer molding method.

9. The method according to claim 1, further comprising singulating the optoelectronic component connected via the leadframe, wherein respectively the terminal regions of adjacent first and second leadframe sections are separated from one another,
the leadframe comprises a plurality of adjacent first and second leadframe sections,
the terminal regions of adjacent first and second leadframe sections connect to one another, pairs of a first and a second leadframe section are embedded in each case into a housing body, and the contact regions of adjacent first and second leadframe sections are arranged in an exposed fashion at the mounting face of a housing body.

10. An optoelectronic component, comprising a housing body, wherein the housing body comprises a mounting face, the housing body comprises an embedded leadframe, the leadframe comprises a first leadframe section and a second leadframe section, the leadframe sections each comprise a contact region and a terminal region, the contact regions are exposed at the mounting face of the housing body, the terminal regions project laterally from the housing body, the housing body is completely enclosed by a molding material, and the terminal regions are not enclosed by the molding material.

11. The optoelectronic component according to claim 10, wherein an optoelectronic semiconductor chip is arranged at the mounting face of the housing body and connects to the contact regions of the leadframe sections.

12. The optoelectronic component according to claim 10, wherein the housing body comprises a cavity, and the mounting face is a bottom of the cavity.

13. The optoelectronic component according to claim 12, wherein an optoelectronic semiconductor chip is arranged at the bottom of the cavity,
a potting material is arranged in the cavity, and
the optoelectronic semiconductor chip is at least partly embedded into the potting material.

14. The optoelectronic component according to claim 10, wherein the molding material forms a lens above the mounting face of the housing body.

15. The optoelectronic component according to claim 13, wherein the molding material and the potting material each comprise an epoxy or a silicone.

16. The optoelectronic component according to claim 11, wherein the optoelectronic semiconductor chip is a laser diode chip, a light emitting diode chip or a photodiode chip.

* * * * *